(12) United States Patent
Kim et al.

(10) Patent No.: US 6,639,143 B2
(45) Date of Patent: Oct. 28, 2003

(54) SOLAR CELL USING FERROELECTRIC MATERIAL(S)

(75) Inventors: Jeong Kim, Seongnam (KR); Dong-Seop Kim, Seoul (KR); Soo-Hong Lee, Suwon (KR)

(73) Assignee: Samsung SDI Co. Ltd., Kyungki-do (KR)

( * ) Notice: Subject to any disclaimer, the term of this patent is extended or adjusted under 35 U.S.C. 154(b) by 0 days.

(21) Appl. No.: 10/144,787

(22) Filed: May 15, 2002

(65) Prior Publication Data

US 2003/0037815 A1 Feb. 27, 2003

(30) Foreign Application Priority Data

Aug. 24, 2001 (KR) .......................... 2001-51440

(51) Int. Cl.[7] .......................... H01L 31/00; H01L 31/06
(52) U.S. Cl. .......................... 136/256; 136/252; 136/265; 257/461; 257/466; 257/434; 257/448; 257/457
(58) Field of Search .......................... 136/252, 256, 136/265; 257/461, 466, 434, 448, 457

(56) References Cited

U.S. PATENT DOCUMENTS 4,236,938 A * 12/1980 Brody .......................... 136/254
4,365,106 A    12/1982 Pulvari .......................... 136/206
4,959,106 A * 9/1990 Nakagawa et al. .......... 136/258
6,081,017 A * 6/2000 Kim et al. .................. 257/431

FOREIGN PATENT DOCUMENTS

| JP | 2000-281346 A | * | 10/2000 |
| JP | 2001-328192 A | * | 11/2001 |
| JP | 2002-179469 A | * | 6/2002 |
| JP | 2002-274956 A | * | 9/2002 |

OTHER PUBLICATIONS

Kirk–Other Encyclopedia of Chemical Technology, 4th edition, vol. 10, (1993), pp. 413–414.*

Encyclopedia Britannica Online, www.search.eb.com, the entry for "ferroelectricirty", (Date unknown).*

Derwent Abstract No. 1997–063843, May 1996.*

* cited by examiner

*Primary Examiner*—Alan Diamond
(74) *Attorney, Agent, or Firm*—Robert E. BUshnell, Esq.

(57) ABSTRACT

A solar cell using a ferroelectric material(s) is provided with a ferroelectric layer at the front surface or the rear surface thereof, or at the front and the rear surfaces thereof. The ferroelectric layer is formed with a ferroelectric material such as $BaTiO_3$, $BST((Ba,Sr)TiO_3)$, $PZT((Pb,Zr)TiO_3)$ and $SBT(SrBi_2Ta_2O_7)$.

20 Claims, 1 Drawing Sheet

SOLAR CELL USING FERROELECTRIC MATERIAL(S)

CLAIM OF PRIORITY

This application makes reference to, incorporates the same herein, and claims all benefits accruing under 35 U.S.C. §119 from an application entitled *SOLAR CELL USING FERROELECTRIC MATERIAL* earlier filed in the Korean Industrial Property Office on Aug. 24, 2001 and there duly assigned Serial No. 2001-51440.

BACKGROUND OF THE INVENTION

1. Field of the Invention

The present invention relates to a solar cell and, more particularly, to a solar cell which makes use of a ferroelectric material or ferroelectric materials.

2. Description of the Related Art

Generally, a solar cell is provided with a structure where pairs of electrons and holes are generated in a semiconductor by way of the light from the outside, and electric fields are formed by way of a pn junction so that the electrons move to the n type semiconductor, and the holes move to the p type semiconductor, thereby producing the required electric power.

In a buried contact solar cell (BCSC) that bears a high efficient solar cell structure, a groove is formed at the front surface of the solar cell, and a conductive material fills the internal space of the groove to thereby form a front metallic electrode of a buried type. In the BCSC structure, an $SiO_2$-based layer is deposited onto the entire front surface of the cell except for the groove area to obtain a surface passivation effect and an anti-reflection effect.

In addition to $SiO_2$, an anti-reflection layer may be deposited with $TiO_2$, $MgF_2$, ZnS and $SiN_x$ and so on, while realizing the desired surface passivation effect through ion implantation, plasma hydrogenated treatment, $SiN_x$ deposition by plasma enhanced chemical vapor deposition (PECVD).

Furthermore, in the BCSC structure, an Al-based layer is deposited, and heat-treated to thereby form a rear electrode with a heavily doped region. Consequently, the open-circuit voltage is increased by way of a rear surface field (BSF) effect, thereby enhancing the efficiency of the solar cell.

However, with such a structure, damage is done to the cell structure during the process of heat-treating the Al-based layer for the rear electrode so that recombination of the electrons and the holes occurs increasingly at the surface area. In order to solve such a problem, a solar cell with a double side buried contact (DSBC) structure where the rear electrode is also buried in the form of a groove is introduced.

However, in the DSBC structure, a shunt path is made between the rear electrode and a floating junction layer so that the desired BSF effect cannot be obtained.

U.S. Pat. No. 6,081,017 discloses an improved technique of solving the above problems. A self-biased solar cell structure is introduced to reduce the degree of recombination of the electrons and the holes at the rear surface area while increasing the open-circuit voltage of the cell and enhancing the energy efficiency thereof. In the structure, a dielectric layer is deposited onto the entire surface of the substrate except for the rear electrode area, and a layer for a voltage application electrode is deposited thereon. The voltage application electrode is connected to the front electrode for the solar cell to thereby produce the desired self-biased voltage. The self-biased voltage is applied to the rear surface area while forming the desired rear surface field there. In this way, the loss of carrier recombination is reduced while enhancing the energy efficiency of the solar cell.

However, in such a technique, the process of connecting the front electrode to the rear electrode should be additionally conducted, and this results in complicated processing steps. As the voltage from the solar cell is used for obtaining the desired rear surface field, the dimension of the rear surface field is limited to the value less than the open-circuit voltage.

U.S. Pat. No. 4,365,106 discloses a solar cell using a ferroelectric material. In the solar cell, the conversion of the optical energy to the electrical energy is made by way of the variation in polarization as a function of the temperature of the ferroelectric material. In the metal-insulator-semiconductor (MIS) structure, a ferroelectric material is used as an insulating material. The temperature of the ferroelectric material may be altered due to the light from the outside. In this case, the surface polarization of the ferroelectric material is varied while generating electric charge. The electric charge induces a strong electric field between the ferroelectric material and the semiconductor to thereby form an inversion layer. The inversion layer severs to make the desired pn junction. Therefore, the pairs of electrons and holes generated due to the light from the outside are separated from each other by way of the internal electric field to thereby produce the desired electrical energy as with the usual solar cell.

However, in such a technique, hetero-junction is made at the pn junction interface between the ferroelectric material and the semiconductor so that the loss by the interfacial recombination of the electrons and the holes is increased. Furthermore, the electrons do not move about well due to the insulating effect of the ferroelectric material, and this lowers the efficiency of the solar cell.

SUMMARY OF THE INVENTION

It is, therefore, an object of the present invention to provide a high efficiency solar cell which involves simplified structural components as well as simplified processing steps.

It is another object of the present invention to provide a high efficiency solar cell which makes use of a ferroelectric material or ferroelectric materials.

These and other objects may be achieved by a solar cell where the front surface or the rear surface thereof or the front and rear surfaces thereof are formed with a ferroelectric layer.

Specifically, the solar cell has a pn structure with a semiconductor substrate of a first conductive type, a semiconductor layer of a second conductive type formed on the first conductive type semiconductor substrate, and a pn junction formed at the interface between the first conductive type semiconductor substrate and the second conductive type semiconductor layer. The first and the second conductive types are opposite to each other in polarity. A front electrode is placed over the pn structure while being connected to the second conductive type semiconductor layer. A rear electrode is placed below the pn structure while being connected to the first conductive type semiconductor substrate. A ferroelectric layer is formed on one of the front surface of the second conductive type semiconductor layer and the rear surface of the first conductive type semiconductor substrate. A poling electrode is formed on at least a part of the ferroelectric layer.

The ferroelectric layer is formed with a ferroelectric material selected from $BaTiO_3$, $BST((Ba,Sr)TiO_3)$, $PZT((Pb,Zr)TiO_3)$, or $SBT(SrBi_2Ta_2O_7)$.

The poling electrode placed on the ferroelectric layer at the front surface of the second conductive type semiconductor layer is formed with a transparent conductive oxide material selected from ITO (indium tin oxide), $RuO_2$, $SrRuO_3$, $IrO_2$, or $La_{1-x}Sr_xCoO_3$.

The poling electrode placed on the ferroelectric layer at the rear surface of the semiconductor substrate is formed with a metallic electrode material selected from Al, Cu, Ag, or Pt.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE PREFERRED EMBODIMENTS

Preferred embodiments of this invention will be explained with reference to the accompanying drawings. The first or second conductive type refers to the p or n type. First, the structure of a solar cell using a ferroelectric according to the present invention is described as below.

Figure 1:
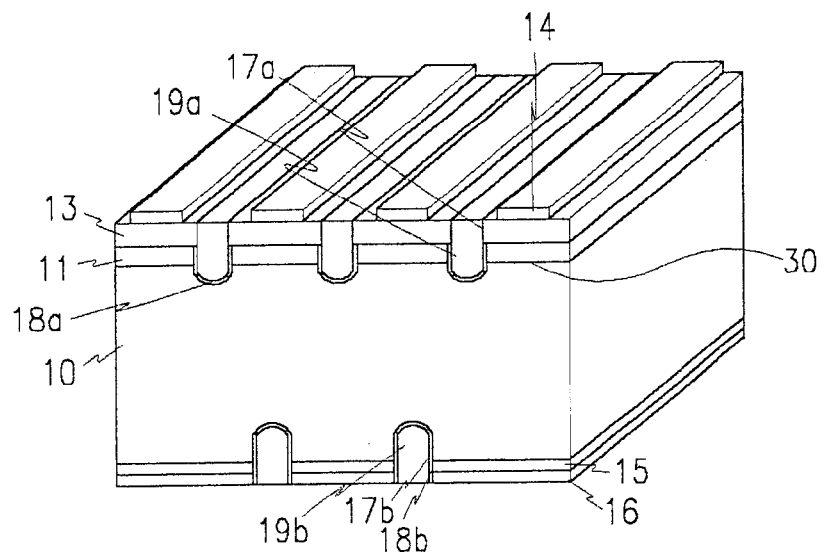
FIG. 1 is a cross sectional view of a solar cell with a double side buried contact (DSBC) structure where a ferroelectric layer is formed at the front surface of the cell according to the present invention.

FIG. 1 is a cross sectional view of a solar cell with a double side buried contact (DSBC) structure where a ferroelectric layer is formed at the front surface of the cell. As shown in FIG. 1, the DSBC solar cell has a pn structure with a semiconductor substrate 10 of a first conductive type, a semiconductor layer 11 of a second conductive type formed on the first conductive type semiconductor substrate 10 while being patterned by way of top grooves 17a, and a pn junction 30 formed at the interface between the first conductive type semiconductor substrate 10 and the second conductive type semiconductor layer 11. The first and the second conductive types are opposite to each other in polarity A ferroelectric layer 13 is formed on the second conductive type semiconductor layer 11 with a ferroelectric material such as $BaTiO_3$, $BST((Ba,Sr)TiO_3)$, $PZT((Pb,Zr)TiO_3)$, and $SBT(SrBi_2Ta_2O_7)$. As the ferroelectric material involves spontaneous polarization in a microscopic scale even at the critical temperature or less, but does not involve the spontaneous polarization in a macroscopic scale due to the domain formation. Therefore, it is necessary to make poling in the polarized direction. In order to make the poling, it is required to provide an electrode for applying voltage from the outside. In this connection, a poling electrode 14 is formed on at least a part of the ferroelectric layer 13.

As the poling electrode 14 covers the front surface of the ferroelectric layer 13, it is preferably formed with a transparent conductive oxide material such as indium tin oxide (ITO), $RuO_2$, $SrRuO_3$, $IrO_2$, $La_{1-x}Sr_xCoO_3$.

Furthermore, the ferroelectric layer 13 involves a surface passivation effect, and takes a role of an anti-reflection layer. Therefore, in the solar cell with such a ferroelectric layer, a layer based on $CeO_2$, $MgF_2$ or $TiO_2$ for an anti-reflection and an layer based on $SiO_2$ or $SiN_x$ for an anti-reflection and a surface passivation may be omitted.

Another second conductive type semiconductor layer 15 is formed on the rear surface of the semiconductor substrate 10 while being patterned by way of bottom grooves 17b. A surface oxide layer 16 is formed on the semiconductor layer 15 to make the desired rear surface reflection.

The top and the bottom grooves 17a and 17b are patterned to have a predetermined depth from the front and the rear surface of the solar cell, and heavily doped regions 18a and 18b where impurities are doped at high concentration are formed at the inner wall of the top and the bottom grooves 17a and 17b. A conductive material fills the internal space of the grooves 17a and 17b to thereby form front electrodes 19a and rear electrodes 19b, respectively.

Figure 2:
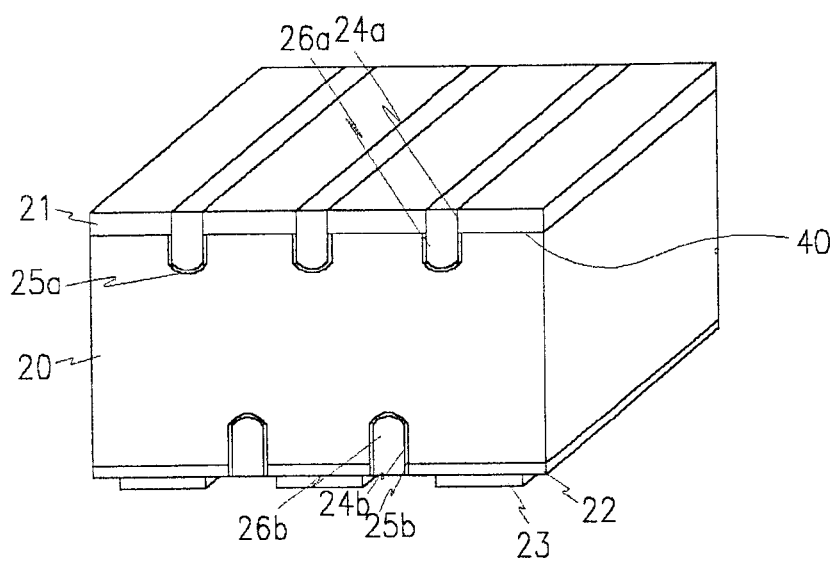
FIG. 2 is a cross sectional view of a solar cell with a DSBC structure where a ferroelectric layer is formed at the rear surface of the cell according to the present invention.

FIG. 2 is a cross sectional view of a solar cell with a DSBC structure where a ferroelectric layer is formed at the rear surface of the cell.

As shown in FIG. 2, the DSBC solar cell has a pn structure with a semiconductor substrate 20 of a first conductive type, a semiconductor layer 21 of a second conductive type formed on the first conductive type semiconductor substrate 20 while being patterned by way of top grooves 24a, and a pn junction 40 formed at the interface between the first conductive type semiconductor substrate 20 and the second conductive type semiconductor layer 21 while being patterned by way of the top grooves 24a. The first and the second conductive types are opposite to each other in polarity.

A ferroelectric layer 22 is formed on the rear surface of the semiconductor substrate 20 while being patterned by way of bottom grooves 24b. A poling electrode 23 for poling the ferroelectric layer 22 is formed on at least a part of the ferroelectric layer 22.

The ferroelectric layer 22 is formed with a ferroeletric material such as $BaTiO_3$, $BST((Ba,Sr)TiO_3)$, $PZT((Pb,Zr)TiO_3)$, and $SBT(SrBi_2Ta_2O_7)$.

In case the ferroelectric layer 22 is positioned at the rear surface of the solar cell, it is not necessary to form such a ferroelectric layer with a transparent conductive oxide material. Therefore, the poling electrode 23 for the ferroelectric layer 22 may be formed with a metallic material such as Al, Cu, Ag and Pt.

The top and the bottom grooves 24a and 24b are formed at the front and the rear surface of the solar cell, and heavily doped regions 25a and 25b where impurities are doped at high concentration are formed at the inner wall of the grooves 24a and 24b, respectively. A conductive material fills the internal space of the grooves 24a and 24b to thereby form front electrodes 26a, and rear electrodes 26b, respectively.

As the ferroelectric layer 22 positioned at the rear surface of the solar cell takes a role of preventing a rear surface reflection, an additional surface oxide layer for preventing the rear surface reflection may be omitted.

Furthermore, as the ferroelectric layer 22 positioned at the rear surface of the solar cell forms a rear surface field, an additional rear surface field layer based on Al may be omitted. It is also possible that a ferroelectric layer is additionally deposited onto the existent Al-based layer to thereby further enhance the rear surface field effect.

Such a ferroelectric layer may be formed at the front and the rear surface of the solar cell, and this structure may be applied for use in various kinds of DSBC or BCSC solar cells.

The operational effects of the ferroelectric layer positioned at the front or the rear surface of the solar cell will now be explained in detail.

Generally, the ferroelectric layer generates polarized electric charge at its surface by way of spontaneous polarization, and a strong electric field is formed at the inside of the semiconductor due to the polarized electric charge. Therefore, in case a ferroelectric layer is formed at the front surface of the solar cell, a surface passivation effect can be obtained.

Specifically, pairs of electron and hole are formed at the inside of the semiconductor by way of the light from the outside, the electrons and the holes are separated from each other due to the electric potential difference made at the pn junction. In case a p type semiconductor is used as the substrate while making the pn junction through diffusion, the electric field at the pn junction is directed from the n type semiconductor to the p type semiconductor. Under the influence of the biased electric field, the electrons are flown to the n type semiconductor, whereas the holes are flown to the p type semiconductor, thereby producing the desired electric power.

However, dangling bonds or impurities are much present at the surface of the semiconductor while serving to be a recombination center for the pairs of electron and hole.

In case a ferroelectric layer is deposited onto the semiconductor substrate while forming a strong electric field at the surface thereof, the pairs of electron and hole inclined to reach the semiconductor surface are separated from each other due to the electric field formed by way of the ferroelectric layer, and hence, prevented from being recombined with each other. In this way, the ferroelectric layer enhances the surface passivation effect. Furthermore, with the deposition of the ferroelectric layer, the open-circuit voltage of the solar cell can be increased to a great scale while enhancing the energy efficiency thereof.

For the same reason, in case a ferroelectric layer is positioned at the rear surface of the solar cell, the desired rear surface field effect can be obtained while increasing the open-circuit voltage of the solar cell and enhancing the energy efficiency thereof.

The ferroelectric layer may further take a role of controlling the reflection of sunlight depending upon variation in the thickness thereof. When the thickness of the ferroelectric layer deposited onto the front surface of the solar cell is controlled to be 1000–1500 Å (Angstroms), it can take a role of an anti-reflection layer for reducing the light reflection rate to a large scale at the front of the solar cell. Similarly, the ferroelectric layer deposited onto the rear surface of the solar cell takes a role of rear surface reflection (BSR) for reflecting the light not absorbed in the semiconductor to the inside of the semiconductor again. In either case, the short circuit current is increased, thereby enhancing the energy efficiency of the solar cell.

A method of fabricating the solar cell with the ferroelectric layer will now be explained in detail.

A second conductive type semiconductor layer 11 is formed on a first conductive type semiconductor substrate 10. This results in a pn structure where a pn junction is formed at the interface between the first conductive type semiconductor substrate 10 and the second conductive type semiconductor layer 11.

Thereafter, a ferroelectric layer 13 is formed on the second conductive type semiconductor layer 11 through depositing a ferroelectric material. The ferroelectric material is selected from $BaTiO_3$, BST($(Ba,Sr)TiO_3$), PZT($(Pb,Zr)TiO_3$), or SBT($SrBi_2Ta_2O_7$). The deposition is made through chemical vapor deposition, sol-gel process, sputtering, or pulse laser deposition. In order to crystallize the ferroelectric material, heat-treatment may be made after the deposition of the ferroelectric layer 13.

In the case of the sol-gel process, the deposited ferroelectric layer is kept to be in an amorphous state. Therefore, in order to obtain a ferroelectric crystalline structure, it is necessary to heat-treat the deposited ferroelectric layer at 450–800° C. (Celsius). In the case of the chemical vapor deposition, the sputtering and the pulse laser deposition, the deposited ferroelectric layer bears a crystalline structure so that it is not necessary to make heat-treatment with respect to the deposited layer. But the heat-treatment may be made to enhance the performance characteristic of the ferroelectric layer.

Thereafter, a poling electrode 14 is formed on at least a part of the ferroelectric layer 13. The target material for the poling electrode 14 may be determined depending upon the position of the ferroelectric layer. As shown in FIG. 1, when the ferroelectric layer 13 is positioned at the front surface of the solar cell, it is formed with a transparent conductive oxide material such as ITO, $RuO_2$, $SrRuO_3$, $IrO_2$, and $La_{1-x}Sr_xCoO_3$.

The ferroelectric layer 13 positioned at the front surface of the solar cell involves a surface passivation effect, and takes a role of an anti-reflection layer. Therefore, in the solar cell with such a ferroelectric layer, a layer based on $CeO_2$, $MgF_2$, $TiO_2$, $SiO_2$ or $SiN_x$ for an anti-reflection or a surface passivation may be omitted.

Thereafter, another second type semiconductor layer 15 is formed on the rear surface of the semiconductor substrate 10, and a surface oxide layer 16 is formed on the semiconductor layer 15 to make the desired rear surface reflection.

A plurality of grooves 17a and 17b are formed at the front and the rear surface of the solar cell with a predetermined depth. Heavily doped regions 18a and 18b where impurities are doped at high concentration are formed at the inner wall of the grooves 17a and 17b, and a conductive material fills the internal space of the grooves 17a and 17b to thereby form front electrodes 19a and rear electrodes 19b. Consequently, a solar cell is completed with a DSBC structure shown in FIG. 1.

In operation, after the ferroelectric layer 13 is poled using the poling electrode 14 and the rear electrode 19b, the electric power is extracted from the solar cell via the front electrode 19a and the rear electrode 19b. In case such a ferroelectric layer is placed at the rear surface of the solar cell, the ferroelectric layer 22 is poled using the poling electrode 23 and the front electrode 26a, and the electric power is extracted from the solar cell via the front electrode 26a and the rear electrode 26b.

As described above, when a ferroelectric layer is formed at the front or the rear surface of the solar cell, an internal electric field is formed at the surface of the semiconductor by way of the spontaneous polarization of the ferroelectric layer. Consequently, the pairs of electron and hole are separated from each other due to the electric field so that recombination of the electrons and holes is prevented, and the desired surface passivation effect is obtained due to the formation of a rear surface field.

Accordingly, it becomes possible to omit an Al-based layer for forming the rear surface field while simplifying the structural components and the processing steps. Furthermore, even with the presence of the rear surface field formation layer, a ferroelectric layer maybe additionally formed on the rear surface field formation layer to maximize the surface passivation effect.

When an Al-based layer is deposited to form the desired rear surface field in a conventional art, heat treatment at 800–900° C. should be made with respect to the Al-based layer. In case the Al-based layer is replaced by a PZT-based layer, the temperature of heat treatment for the PZT-based layer may be lowered to be 600° C. In this case, it can be prevented that the lifetime of the minority carriers is reduced due to the high temperature processing while deteriorating the efficiency of the solar cell.

As described above, in case the internal electric field is formed at the surface of the semiconductor, the open-circuit voltage of the solar cell is increased so that the efficiency of the solar cell can be enhanced.

As the ferroelectric layer conducts its function of controlling the reflection of light by varying the thickness thereof, the light reflection at the front surface of the solar cell is prohibited while re-directing the non-used light to the semiconductor at the rear surface of the cell.

Accordingly, it becomes possible to omit an anti-reflection layer based on $SiO_2$, $Si_3N_4$, $CeO_2$ or $MgF_2$ while simplifying the structural components and the processing steps.

Furthermore, when the light reflection is controlled by way of the ferroelectric layer, the short-circuit current is increased while enhancing the efficiency of the solar cell.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A solar cell, comprising:
   a semiconductor substrate of a first conductive type;
   a semiconductor layer of a second conductive type formed on a front surface of said first conductive type semiconductor substrate, the first and the second conductive types being opposite to each other in polarity, a pn junction formed at the interface between said first conductive type semiconductor substrate and said second conductive type semiconductor layer;
   a front electrode contacted with a portion of said second conductive type semiconductor layer;
   a rear electrode contacted with a portion of said first conductive type semiconductor substrate;
   a ferroelectric layer formed on at least one of a front surface of said second conductive type semiconductor layer and a rear surface of said first conductive type semiconductor substrate; and
   a poling electrode formed on at least a part of said ferroelectric layer.

2. The solar cell of claim 1, wherein said ferroelectric layer is formed with a ferroelectric material selected from $BaTiO_3$, BST($(Ba,Sr)TiO_3$), PZT($(Pb,Zr)TiO_3$), and SBT ($SrBi_2Ta_2O_7$).

3. The solar cell of claim 1, wherein said poling electrode is placed on said ferroelectric layer at the front surface of said second conductive type semiconductor layer and is formed with a transparent conductive oxide material.

4. The solar cell of claim 3, wherein said transparent conductive oxide material for said poling electrode is selected from ITO (indium tin oxide), $RuO_2$, $SrRuO_3$, $IrO_2$, and $La_{1-x}Sr_xCoO_3$.

5. The solar cell of claim 1, wherein said poling electrode is placed on said ferroelectric layer at the rear surface of said first conductive semiconductor substrate and is formed with a metallic electrode material selected from Al, Cu, Ag, and Pt.

6. A solar cell, comprising:
   a semiconductor substrate of a first conductive type;
   a semiconductor layer of a second conductive type formed on a front surface of said first conductive type semiconductor substrate, the first and the second conductive types being opposite to each other in polarity, a pn junction formed at the interface between said first conductive type semiconductor substrate and said second conductive type semiconductor layer;
   a ferroelectric layer formed on a front surface of said second conductive type semiconductor layer;
   a poling electrode formed on at least a part of said ferroelectric layer;
   a surface oxide layer formed on a rear surface of said first conductive type semiconductor substrate;
   a plurality of grooves formed at a front surface of said ferroelectric layer and a rear surface of said surface oxide layer, with a predetermined depth to expose said semiconductor substrate; and
   front and rear electrodes comprising a conductive material filling the plurality of grooves.

7. The solar cell of claim 6, further comprising:
   a heavily doped region of a second conductive type between said front electrodes and an internal surface of the plurality of grooves formed at said front surface of said ferroelectric layer; and
   a heavily doped region of a first conductive type between said rear electrodes and an internal surface of the plurality of grooves formed at the rear surface of said surface oxide layer.

8. The solar cell of claim 6, wherein the ferroelectric layer is formed with a ferroelectric material selected from $BaTiO_3$, BST($(Ba,Sr)TiO_3$), PZT($(Pb,Zr)TiO_3$) and SBT ($SrBi_2Ta_2O_7$).

9. The solar cell of claim 6, wherein said poling electrode is formed with a transparent conductive oxide material.

10. The solar cell of claim 9, wherein said transparent conductive oxide material for said poling electrode is selected from ITO (indium tin oxide), $RuO_2$, $SrRuO_3$, $IrO_2$, and $La_{1-x}Sr_xCoO_3$.

11. A solar cell, comprising:
   a semiconductor substrate of a first conductive type;
   a semiconductor layer of a second conductive type formed on a front surface of said first conductive type semiconductor substrate, the first and the second conductive types being opposite to each other in polarity, a pn junction formed at the interface between said first conductive type semiconductor substrate and said second conductive type semiconductor layer;
   a ferroelectric layer formed on a rear surface of said first conductive type semiconductor substrate;
   a poling electrode formed on at least a part of said ferroelectric layer;
   a plurality of grooves formed at a front surface of said second conductive type semiconductor layer and a rear surface of said ferroelectric layer, with a predetermined depth to expose said semiconductor substrate; and
   front and rear electrodes comprising a conductive material filling the plurality of grooves.

12. The solar cell of claim 11, further comprising:

a heavily doped region of a second conductive type between said front electrodes and an internal surface of the plurality of grooves formed at the front surface of said second conductive type semiconductor layer; and a heavily doped region of a first conductive type between said rear electrodes and an internal surface of the plurality of grooves formed at the rear surface of said ferroelectric layer.

13. The solar cell of claim 11, wherein said ferroelectric layer is formed with a ferroelectric material selected from $BaTiO_3$, $BST((Ba,Sr)TiO_3)$, $PZT((Pb,Zr)TiO_3)$ and SBT $(SrBi_2Ta_2O_7)$.

14. The solar cell of claim 11, wherein said poling electrode is formed with a metallic electrode material selected from Al, Cu, Ag, and Pt.

15. A solar cell, comprising:

a semiconductor substrate of a first conductive type;

a semiconductor layer of a second conductive type formed on a front surface of said first conductive type semiconductor substrate, the first and the second conductive types being opposite to each other in polarity, a pn junction formed at the interface between said first conductive type semiconductor substrate and said second conductive type semiconductor layer; and a ferroelectric layer formed on at least one of a front surface of said second conductive type semiconductor layer and a rear surface of said first conductive type semiconductor substrate.

16. The solar cell of claim 15, further comprising a poling electrode formed on at least a portion of said ferroelectric layer.

17. The solar cell of claim 16, further comprised of said ferroelectric layer being formed with a ferroelectric material selected from $BaTiO_3$, $BST((Ba,Sr)TiO_3)$, $PZT((Pb,Zr)TiO_3)$, and $SBT(SrBi_2Ta_2O_7)$.

18. The solar cell of claim 16, further comprised of said poling electrode being placed on said ferroelectric layer at the front surface of said second conductive type semiconductor layer and being formed with a transparent conductive oxide material.

19. The solar cell of claim 18, with said transparent conductive oxide material for said poling electrode being selected from ITO (indium tin oxide), $RuO_2$, $SrRuO_3$, $IrO_2$, and $La_{1-x}Sr_xCoO_3$.

20. The solar cell of claim 16, said poling electrode being placed on said ferroelectric layer at the rear surface of said first conductive semiconductor substrate and being formed with a metallic electrode material selected from Al, Cu, Ag, and Pt.

* * * * *